United States Patent [19]

Alvord et al.

[11] Patent Number: 4,621,240
[45] Date of Patent: Nov. 4, 1986

[54] TEMPERATURE COMPENSATED OSCILLATOR FOR RASTER SCANNED VIDEO DISPLAY

[75] Inventors: Robert J. Alvord, Elmwood Park; Robert Amberg, Westmont; Michael T. Fegan, Chicago; Joseph Kadlec, Berwyn, all of Ill.

[73] Assignee: Zenith Electronics Corporation, Glenview, Ill.

[21] Appl. No.: 750,349

[22] Filed: Jun. 28, 1985

[51] Int. Cl.[4] .............................................. H03K 3/281
[52] U.S. Cl. .................................. 331/113 R; 331/145; 331/176; 358/148
[58] Field of Search ................... 331/113 R, 144, 145, 331/172, 176; 358/148, 158; 315/364

[56] References Cited

U.S. PATENT DOCUMENTS 3,341,788  9/1967  Nishioka ............................. 331/144
4,253,117  2/1981  Kadlec ............................. 331/145 X

FOREIGN PATENT DOCUMENTS 0960781  6/1964  United Kingdom ................. 331/113

*Primary Examiner*—Eugene R. LaRoche
*Assistant Examiner*—D. C. Mis

[57] ABSTRACT

In the horizontal drive of a raster scanned video display, a free running astable multivibrator responsive to a synchronization input signal provides a horizontal output signal to horizontal deflection circuitry for synchronizing the video display's raster scan with the video information presented thereon. The astable multivibrator includes a pair of coupled transistors which are alternately rendered conductive in accordance with the time constant of a respective RC network associated with each transistor. To compensate for the temperature-dependent operation of the transistor pair which causes the multivibrator's operating frequency to increase with increasing temperature, a pair of back-to-back coupled diodes are connected to provide the synchronization input signal to one RC network so as to increase the charge on a capacitor within the network, the time constant of which is similarly increased. The temperature-dependent change in voltage across the diodes compensates for the change in $V_{BE}$ of the transistor with temperature to maintain the time before transistor turn-on constant. A second pair of similarly coupled diodes may be connected to the second RC network to provide temperature compensation for the second transistor.

11 Claims, 3 Drawing Figures

TEMPERATURE COMPENSATED OSCILLATOR FOR RASTER SCANNED VIDEO DISPLAY

BACKGROUND OF THE INVENTION

This invention relates generally to temperature compensation in an electronic circuit and is particularly directed to a temperature compensated oscillator circuit such as employed in a horizontal drive system of a raster scanned video display.

Video information received by a television receiver is presented on a raster which is scanned horizontally at a first rate, and vertically at a second, generally slower rate. The video information is provided in the form of amplitude-modulated synchronizing pulses which are used for synchronizing the raster scan of the television receiver's cathode ray tube (CRT) with the received video information. For proper picture framing, the frequency and phase of oscillation produced by the television receiver's horizontal sweep system must be accurately synchronized with the frequency and phase of a horizontal synchronization signal transmitted from the broadcast station.

In television receivers where a standard input synchronization signal frequency is used, a phase locked loop is utilized to detect the synchronization pulses and to control a horizontal-rate oscillator at a frequency which is an average of the incoming synchronizing signals. In video displays such as used in computer terminals or data display systems where a great variety of input synchronization signals may be encountered, the phase locked loop approach may be replaced by the combination of a monostable multivibrator and a free-running astable multivibrator in the horizontal drive circuit of the video display.

The monostable multivibrator is responsive to a horizontal drive or synchronization input signal for triggering the astable multivibrator in well-defined time relation with respect to the horizontal drive signal. Upon receipt of a synchronization signal, the monostable multivibrator is driven to an unstable state for a predetermined time. A reduction in synchronization input signal amplitude due to an input signal voltage cutoff threshold which reduces spurious multivibrator inputs is compensated for by coupling the synchronization input from the monostable multivibrator to the emitter and collector of both of the astable multivibrator's coupled transistors. This multivibrator combination, by increasing synchronization signal injection to the astable multivibrator, provides an increase in the synchronization signal frequency capture range. An example of this synchronization signal processing arrangement for use in a raster scanned video display can be found in U.S. Pat. No. 4,253,117 which is assigned to the assignee of the present application.

Although representing an improved approach to the synchronization of horizontal sweep with video synchronization input pulses in a raster scanned video display, the free-running astable multivibrator tends to drift in frequency with temperature resulting in a horizontal drift in the video image presented on the faceplate of the CRT. Frequently, a manual adjustment in the form of a potentiometer is provided for compensating for this temperature-dependent drift and permitting the horizontal centering of the video image. However, this requires intervention by the user and is thus somewhat unreliable and inconvenient. In addition, frequently the manual horizontal adjustment means is located within the unit's chassis and is limited for use in the initial set-up and adjustment of the video display unit during its manufacture. This adjustment control is therefore frequently not accessible to, nor intended for use by, a user/viewer of the video display unit.

The prior art discloses various approaches for automatic temperature compensation in an oscillator circuit. One common approach makes use of temperature sensitive components such as a thermistor to compensate for the temperature dependent operating characteristics of other oscillator circuit components. Examples of this approach can be found in U.S. Pat. Nos. 4,380,745 to Barlow et al and 4,412,188 to Helle et al. While perhaps providing a practial solution to temperature compensation in specialized circuits, the substantial cost of thermistors renders their use somewhat impractical in mass produced, consumer-type products.

The present invention represents an improvement over the prior art by providing a low cost, reliable and accurate temperature compensated oscillator particularly adapted for use in the horizontal drive circuit of a raster scanned video display.

OBJECTS OF THE INVENTION

Accordingly, it is an object of the present invention to provide improved synchronization of electron beam sweep with video information presented on a raster scanned video display.

It is another object of the present invention to provide stable operation in a horizontal oscillator of a raster scanned video display over a wide operating temperature range.

Yet another object of the present invention is to provide temperature compensated operation in a free-running astable multivibrator circuit.

A further object of the present invention is to provide a free-running oscillator having a constant frequency over a wide operating temperature range.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings in which:

DETAILED DESCRIPTION OF THE PREFERRED EMBODIMENT

Figure 1:
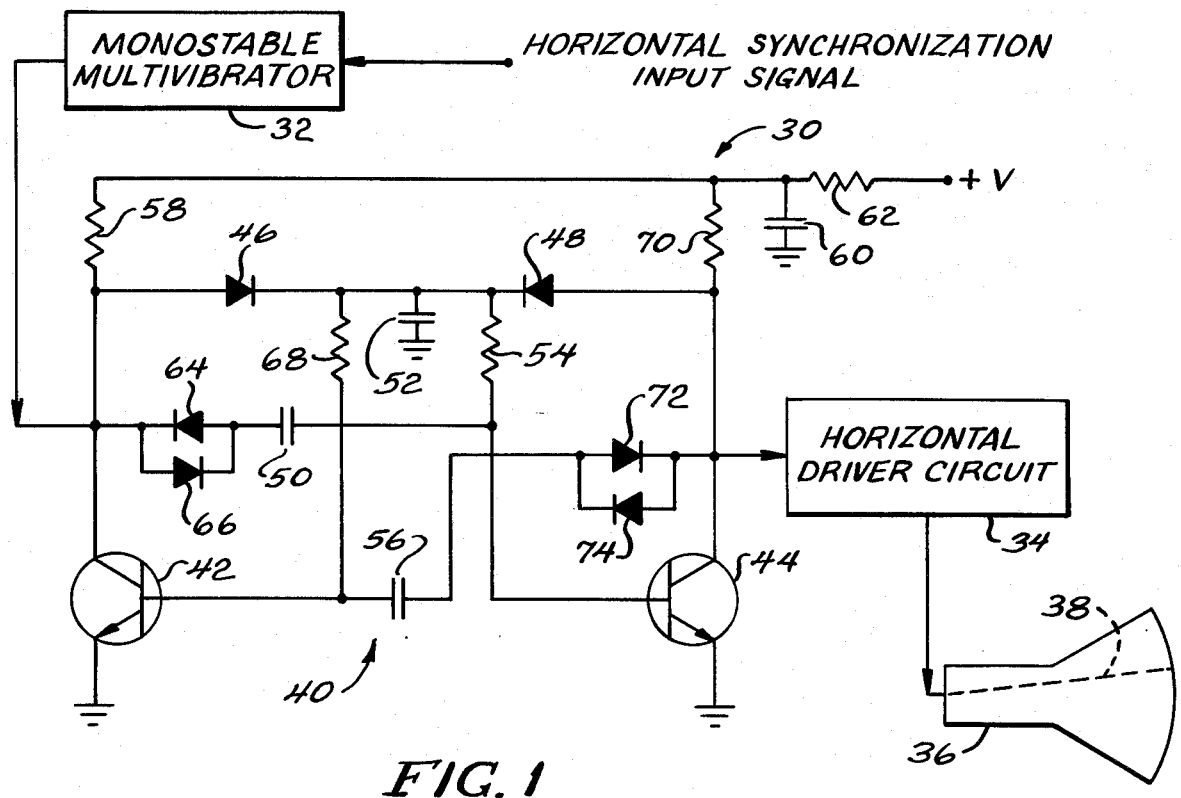
FIG. 1 is a schematic diagram of a temperature compensated horizontal oscillator in accordance with the principles of the present invention.

Referring to FIG. 1, there is shown in combined simplified schematic and block diagram form a horizontal synchronizing circuit 30 which includes a temperature compensated horizontal oscillator 40 in accordance with the present invention. The horizontal synchronizing circuit 30 receives a horizontal synchronization input signal and processes this signal by means of a monostable multivibrator 32 in combination with the temperature compensated horizontal oscillator 40 of the present invention in providing an output signal for synchronization and phasing of a horizontal drive circuit 34 with the synchronization input signal. The horizontal driver circuit 34 is coupled to and energizes deflection circuitry in a cathode ray tube (CRT) 36 for deflecting an electron beam 38 therein in a conventional manner.

The monostable multivibrator 32 is a one-shot, state-changing device possessing only one stable state which goes from OFF to the ON position for a specific length of time and then goes to the OFF position waiting for another synchronization pulse. Means may be provided for within the monostable multivibrator circuit 32 to vary the length of ON time as desired. Since virtually any conventional monostable multivibrator circuit may be used with the temperature compensated horizontal oscillator 40 of the present invention, additional details of this circuit are not provided herein.

The output of the monostable multivibrator 32 is a synchronization pulse which is provided to the temperature compensated horizontal oscillator 40 comprised primarily of NPN transistors 42 and 44. The temperature compensated horizontal oscillator 40 is a free-running astable multivibrator which oscillates at whatever frequency it is designed for until it receives a synchronization pulse, at which time it will lock onto the frequency of the synchronization pulse which may be different than its original frequency.

The synchronization pulse provided to the horizontal oscillator 40 is delivered via back-to-back coupled diodes 64 and 66 and capacitor 50 to the base of transistor 44. The synchronization pulse pulls the base of transistor 44 down and increases the voltage across its base-emitter junction ) ($V_{BE}$) resulting in the turn-off of transistor 44. When transistor 44 is rendered nonconductive, an output pulse is provided from the horizontal oscillator 40 to horizontal driver circuitry 34. The synchronization pulse input is also provided to the collector of transistor 42 thus permitting increased input synchronization signal capture by the horizontal oscillator circuit 40.

A +V voltage is provided to the respective collectors of transistors 42 and 44 via resistors 58 and 70, respectively. Resistor 58 provides a collector load resistance for transistor 42 and, in combination with resistor 62, forms a voltage divider which limits the voltage at the collector of transistor 42. Similarly, resistor 70 provides a collector load resistance for transistor 44 and, in combination with resistor 62, limits the voltage at the collector of that transistor. In addition, resistor 58 provides a DC bias for diode 46 which maintains it in a constant ON state except when a negative synchronization pulse is provided to the horizontal oscillator circuit 40. Resistor 70 performs a similar function with respect to diode 48. Grounded capacitor 52 establishes a constant DC level at the cathodes of each of diodes 46 and 48. The combination of grounded capacitor 60 and resistor 62 performs a filtering and current limiting function with respect to the +V input voltage provided to the collectors of transistors 42 and 44.

Resistors 54 and 68 in combination with capacitors 50 and 56 provide a pair of RC networks which establish the timing of the astable multivibrator which comprises the horizontal oscillator 40. A negative input pulse is provided via diodes 64 and 66 to capacitor 50 for the charging thereof. Capacitor 50 is charged and discharges to the base of transistor 44 in accordance with the RC time constant of capacitor 50 and resistor 54. This RC network determines how long transistor 44 remains nonconducting following receipt of a synchronization pulse from the monostable multivibrator 32.

With transistor 44 rendered nonconductive, an output synchronization signal is provided to the horizontal driver circuit 34. In addition, an input pulse is provided via the RC network comprised of capacitor 56 and resistor 68 to the base of transistor 42. Transistor 42 is rendered conductive upon the discharge of capacitor 56, with the RC time constant of capacitor 56 and resistor 68 determining how long transistor 42 remains nonconductive.

The output of transistor 44 provides a re-synchronized, properly timed input waveform to the horizontal driver circuit 34. A synchronization pulse which may have been in an improper position in timing may thus be moved in real time, insofar as the video signal is concerned, into proper position with respect to operation of the horizontal drive circuit 34. An input drive pulse may thus be converted to a synch pulse of proper synchronization in energizing the horizontal driver circuit 34.

Figure 2:
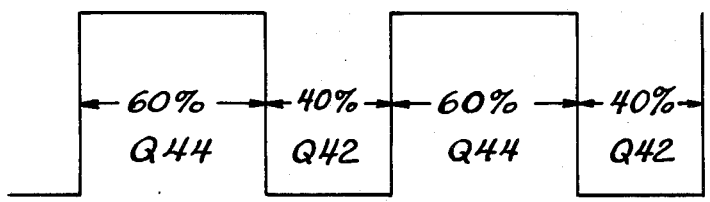
FIG. 2 illustrates the timed operation of the coupled transistors in the temperature compensated horizontal oscillator of FIG. 1.

Referring to FIG. 2, there is shown the relative conducting periods of the two transistors 42, 44 in the horizontal oscillator circuit 40. As shown in FIG. 2, transistor 44 has a 60% duty cycle, while transistor 42 has a 40% duty cycle. The relative duty cycles of the transistors 42 and 44 are established by the time constants of the respective RC networks coupled thereto. For example, the duty cycle of transistor 44 is established by the values of capacitor 50 and resistor 54. Similarly, the duty cycle of transistor 42 is established by the values of capacitor 56 and resistor 68. The relative duty cycles of these transistors establish the pulse width of the output signal provided to the horizontal driver circuit 34. The horizontal driver circuit 34 is thus responsive to the pulse width of the horizontal sync signal provided thereto from the horizontal oscillator 40 and operates in timed relation with respect thereto.

It is a characteristic of transistors that as their operating temperature increases, the $V_{BE}$ voltage across the transistor decreases at a rate of approximately 2 millivolts per degree C. Thus, over a 25° C. rise in operating temperature, the change in $V_{BE}$ within the transistor will be approximately 50 millivolts. Thus, the voltage across the base-emitter junction of the transistor will be reduced from 0.7 volts to approximately 0.65 volts (or $0.7 - 0.05 = 0.65$ volts). This affects the firing point of the base to emitter junction of the transistor and, where the transistor is used in an oscillator, the frequency of the oscillator will increase since the transistor within the oscillator is turned on more rapidly. Where an RC time constant rise is used to trigger, or turn on, a transistor, an increase in operating temperature makes the RC time constant appear shorter thereby increasing the free running frequency of the horizontal oscillator 40. This difference in the frequency of the output synchronization signal provided to the horizontal driver circuit 34 will, in turn, result in a horizontal shift of a video image presented upon the CRT 36.

In accordance with the present invention, a pair of back-to-back coupled silicon diodes 64 and 66 are connected between the output of the monostable multivibrator 32 and the base of transistor 44. The diodes 64, 66 exhibit the same temperature characteristics as the base to emitter junction of transistor 44 and provide temperature compensation for the change in the breakdown voltage across the base to emitter junction of the transistor with temperature. The diodes 64 and 66 are coupled in the horizontal oscillator 40 where the synchronization pulse is provided to the RC network comprised of capacitor 50 and resistor 54 which determines the turn-on time of transistor 44. The diodes 64 and 66 are coupled in circuit so as to provide an equal, but opposite, response in the horizontal oscillator 40 to a change in operating temperature so as to closely approximate zero temperature drift within the horizontal oscillator. In other words, the change in operation of transistor 44 with temperature is exactly cancelled out by the temperature dependent operating characteristics of the coupled diodes 64 and 66.

Under normal operating conditions with a change in operating temperature, the timing capacitor 50 is charged to a $-6$ V on the side of the capacitor which is coupled to the base of transistor 44. The voltage on that portion of the timing capacitor 50 coupled to transistor 44 will rise to 0.7 V above neutral ground potential which represents the turn-on, or firing, voltage of the transistor to overcome the base to emitter junction potential in rendering transistor 44 conductive. With an increase in temperature, the potential on the capacitor 50 is reduced as a result of a reduction in the breakdown voltage across the base-emitter junction of transistor 44 to approximately 0.65 V. This has the same effect as reducing the time constant of the RC network comprised of capacitor 50 and resistor 54.

In order to compensate for this apparent change in the time constant of the RC network which establishes the turn-on point of transistor 44, the present invention increases the charge across timing capacitor 50 by an amount equivalent to the change in the base-emitter voltage across transistor 44 arising from changes in the operating temperature. The back-to-back coupled diodes 64 and 66 are connected to the timing capacitor 50 such that the charge across this capacitor arising from the synchronization pulses provided thereto increases with temperature at the same rate as the base to emitter breakdown voltage across transistor 44 decreases with temperature. This is due to the substantially identical temperature dependent operating characteristics of the diodes 64, 66 and transistor 44. By thus increasing the charge upon capacitor 50, the RC time constant of the timing network comprised of capacitor 50 and resistor 54 appears to change with temperature resulting in no apparent change in the time from maximum charging of capacitor 50 to turn-on of transistor 44.

In this arrangement, the charge across capacitor 50 equals the voltage drop across resistor 58 and diode 64. With the voltage drop across diode 64 varying with operating temperature in the same manner as the $V_{BE}$ voltage of transistor 44, the charge across capacitor 50 will change by the same amount as the change in $V_{BE}$ of transistor 44 to provide temperature compensation in the horizontal oscillator circuit.

Figure 3:
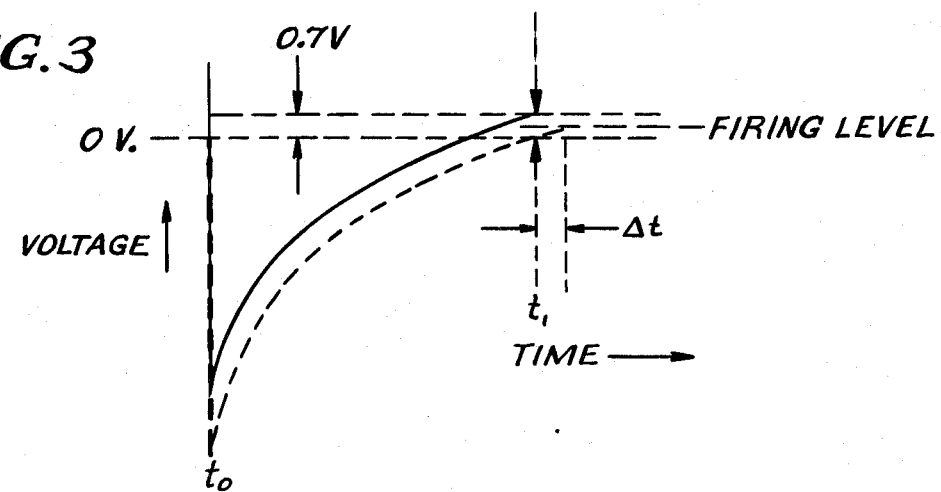
FIG. 3 illustrates the manner in which the horizontal oscillator of FIG. 1 compensates for differences in operating temperature in providing an output signal of essentially constant frequency.

The manner in which temperature compensation is provided for in the horizontal oscillator 40 of the present invention is graphically illustrated in FIG. 3. The charging and discharging of a timing capacitor as used in prior art oscillator circuits is shown in solid line form in FIG. 3. The increased charge provided across the timing capacitor 50 in accordance with the present invention is shown in dotted line form in the figure. From the figure, it can be seen that the increased charge across the timing capacitor 50 results in an increase of $\Delta t$ in the discharge time of the timing capacitor. By increasing the charge across the timing capacitor 50, the time required to fully discharge the capacitor is increased slightly to compensate for the reduced base to emitter junction breakdown voltage across transistor 44 arising from increased operating temperatures. Thus, the reduction in the base to emitter junction breakdown voltage across transistor 44 is compensated for by increasing the discharge time of capacitor 50 to maintain the turn-on time of transistor 44 essentially unchanged over a wide operating temperature range.

While the present invention has thus far been described in terms of compensating for temperature variation in the operation of one transistor in the astable multivibrator horizontal oscillator circuit 40, this invention also contemplates compensating for the temperature dependent operation of the other transistor within the horizontal oscillator. Thus, diodes 72 and 74 are coupled in a back-to-back manner in parallel between the collector of transistor 44 and the timing capacitor 56. Timing capacitor 56 in combination with resistor 68 establishes the turn-on time of transistor 42. By thus coupling diodes 72 and 74 to the timing capacitor 56, the RC time constant of the timing network comprised of capacitor 56 and resistor 68 is made to appear longer by increasing the charge across the timing capacitor so as to delay the turn-on time of transistor 42. By thus delaying the turn-on time of transistor 42, the temperature dependent reduction in its base to emitter junction voltage is compensated for and its operation is stabilized over a wide temperature range. By thus coupling a pair of back-to-back connected diodes to each transistor in the horizontal oscillator 40, its free-running frequency may be stabilized over a wide operating temperature range.

There has thus been shown a temperature compensated horizontal oscillator particularly adapted for use in the horizontal drive system of a raster scanned video display. The horizontal oscillator compensates for temperature dependent variations in the base-emitter junction voltage of transistors in the oscillator by controlling their turn-on as a function of temperature to ensure stable oscillator operation over a wide operating temperature range.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In a horizontal deflection circuit responsive to a synchronization signal for providing horizontal drive signals to deflection circuitry for horizontally scanning an electron beam across a faceplate of a raster scanned video display in timed relation with video information presented on said video display, a temperature compensated oscillator comprising:

first and second timing networks respectively directly and indirectly responsive to the synchronization signal for producing first and second turn-on signals in timed relation with the synchronization signal;

first and second temperature-dependent conducting means respectively coupled to said first and second timing networks and alternately rendered conductive in said timed relation with the synchronization signal by said first and second turn-on signals, respectively, for providing horizontal drive signals to the deflection circuitry; and temperature compensating means including temperature responsive bi-directional conducting means coupled to said first timing network for controlling said first turn-on signal wherein the operation of said first conducting means is substantially independent of the operating temperature of the oscillator.

2. The temperature compensated oscillator of claim 1 wherein each of said timing networks includes at least one resistor and at least one capacitor charged by the synchronization signal so as to generate a respective turn-on signal upon the discharge thereof.

3. The temperature compensated oscillator of claim 2 wherein a respective RC time constant of each timing network establishes the turn-on time of the respective conducting means coupled thereto following receipt of the respective turn-on signal.

4. The temperature compensated oscillator of claim 1 wherein each conducting means includes a respective transistor and wherein the turn-on signal level of each transistor decreases with increasing operating temperature.

5. The temperature compensated oscillator of claim 4 wherein said temperature compensating means increases the time between receipt of a synchronization signal and the generation of said first turn-on signal by said first timing network with increasing operating temperatures in compensating for the decrease in turn-on signal level of the transistor in said first conducting means.

6. The temperature compensated oscillator of claim 5 wherein each timing network includes a respective RC circuit having a characteristic time constant and wherein said temperature compensating means regulates the discharging of the RC circuit of said first timing network in controlling the timing of said first turn-on signal.

7. The temperature compensated oscillator of claim 6 wherein said temperature compensating means increases the charge across a capacitor in the RC network of said first timing network for delaying the occurrence of said first turn-on signal in maintaining the turn-on of the transistor in said first conducting means substantially unchanged with increasing operating temperatures.

8. The temperature compensated oscillator of claim 7 wherein said temperature responsive bi-directional conducting means provides said increased charge across said capacitor with increasing operating temperatures and allows for the discharge of said capacitor.

9. The temperature compensated oscillator of claim 1 wherein said temperature compensating means includes a pair of back-to-back coupled diodes connected to said capacitor.

10. The temperature compensated oscillator of claim 1 wherein said oscillator is a free-running astable multivibrator and wherein said temperature compensating means is further coupled to said second timing network for controlling said first and second turn-on signals and the operation of said first and second conducting means for maintaining the operation of said free-running astable multivibrator independent of its operating temperature.

11. The temperature compensated oscillator of claim 10 wherein each of said timing networks includes a respective RC circuit and each of said conducting means includes a respective transistor and wherein said temperature compensating means includes first and second pairs of back-to-back coupled diodes connected to a capacitor in said respective RC circuit for increasing the charge thereon with increasing operating temperatures and maintaining the turn-on of said transistors unchanged with increasing operating temperatures.

* * * * *